United States Patent
Haider et al.

(10) Patent No.: US 9,112,011 B2
(45) Date of Patent: Aug. 18, 2015

(54) FET DIELECTRIC RELIABILITY ENHANCEMENT

(71) Applicant: Texas Instruments Incorporated, Dallas, TX (US)

(72) Inventors: Asad Mahmood Haider, Plano, TX (US); Jungwoo Joh, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/537,455

(22) Filed: Nov. 10, 2014

(65) Prior Publication Data

US 2015/0060949 A1    Mar. 5, 2015

Related U.S. Application Data

(62) Division of application No. 13/886,744, filed on May 3, 2013, now Pat. No. 8,916,427.

(51) Int. Cl.
| | |
|---|---|
| *H01L 31/0256* | (2006.01) |
| *H01L 29/778* | (2006.01) |
| *H01L 29/51* | (2006.01) |
| *H01L 29/66* | (2006.01) |
| *H01L 29/20* | (2006.01) |
| *H01L 21/28* | (2006.01) |
| *H01L 21/285* | (2006.01) |
| *H01L 29/49* | (2006.01) |
| *H01L 29/45* | (2006.01) |

(52) U.S. Cl.
CPC ...... *H01L 29/7787* (2013.01); *H01L 21/28264* (2013.01); *H01L 21/28575* (2013.01); *H01L 29/2003* (2013.01); *H01L 29/452* (2013.01); *H01L 29/4975* (2013.01); *H01L 29/518* (2013.01); *H01L 29/66462* (2013.01)

(58) Field of Classification Search
CPC ............ H01L 21/28562; H01L 21/288; H01L 21/76805; H01L 29/66545; H01L 21/7685; H01L 29/4966; H01L 21/76843; H01L 29/517; H01L 29/2003; H01L 29/452; H01L 29/4975; H01L 29/518; H01L 29/7787
USPC .................... 257/76, 190, 192, 194, E21.403, 257/E29.246, E29.091; 438/46, 172–177, 438/285–299, 481

See application file for complete search history.

(56) References Cited

U.S. PATENT DOCUMENTS

| | | |
|---|---|---|
| 8,633,094 B2 | 1/2014 | Ramdani et al. |
| 2012/0156836 A1 | 6/2012 | Shealy et al. |
| 2013/0234153 A1 | 9/2013 | Lidow et al. |
| 2014/0191240 A1* | 7/2014 | Chiang et al. .................. 257/76 |

* cited by examiner

*Primary Examiner* — Dung Le

(74) *Attorney, Agent, or Firm* — Jacqueline J. Garner; Frank D. Cimino

(57) ABSTRACT

A semiconductor device may be formed by forming a silicon-containing gate dielectric layer over a semiconductor layer. A gate metal layer is formed over the gate dielectric layer; the gate metal layer includes 2 atomic percent to 10 atomic percent silicon during formation. The gate metal layer is patterned to form a metal gate. Source and drain contact holes are subsequently formed, and contact metal is formed and patterned in the contact holes. A subsequent contact anneal heats the contact metal and gate for at least 30 seconds at a temperature of at least 750° C.

8 Claims, 5 Drawing Sheets

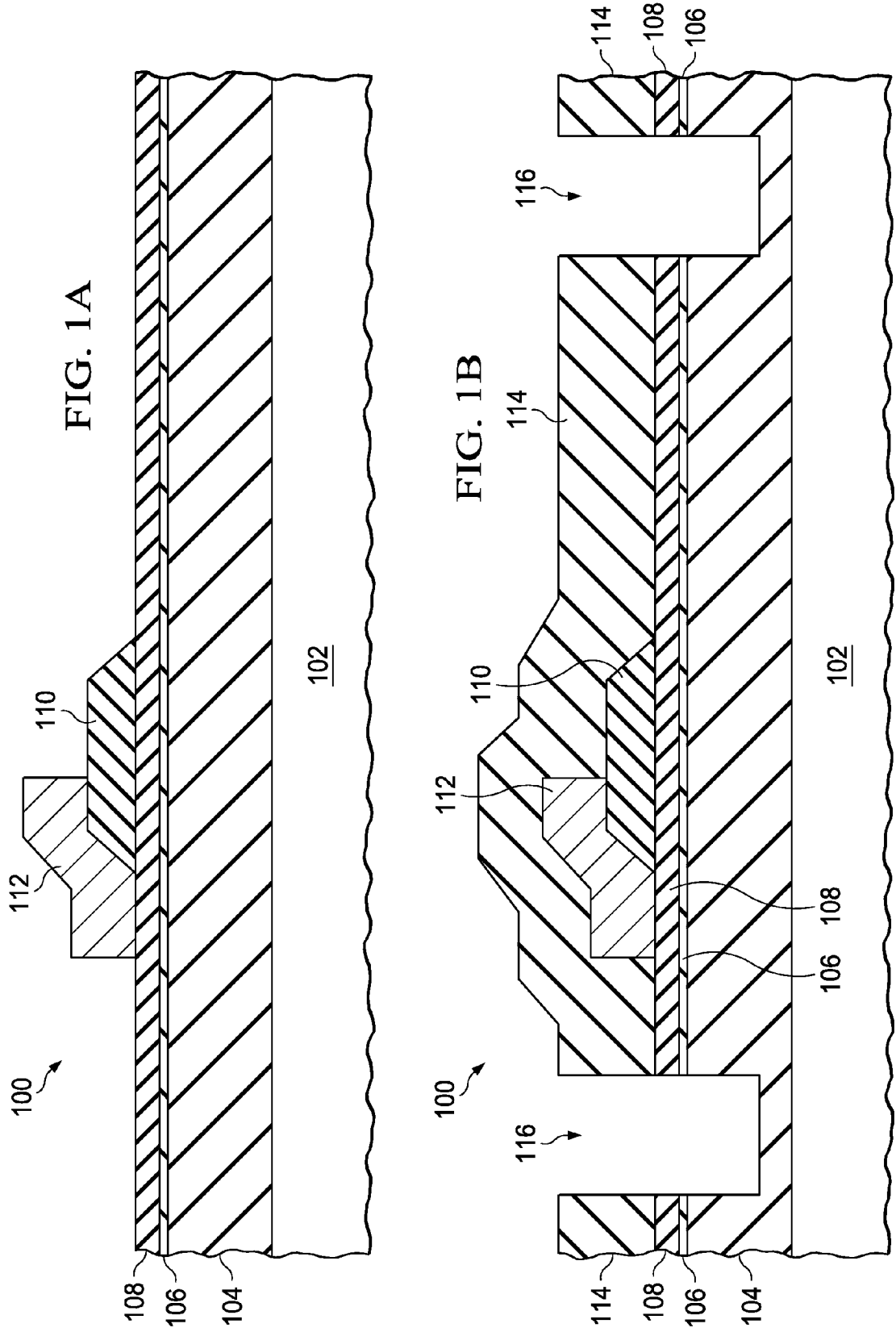

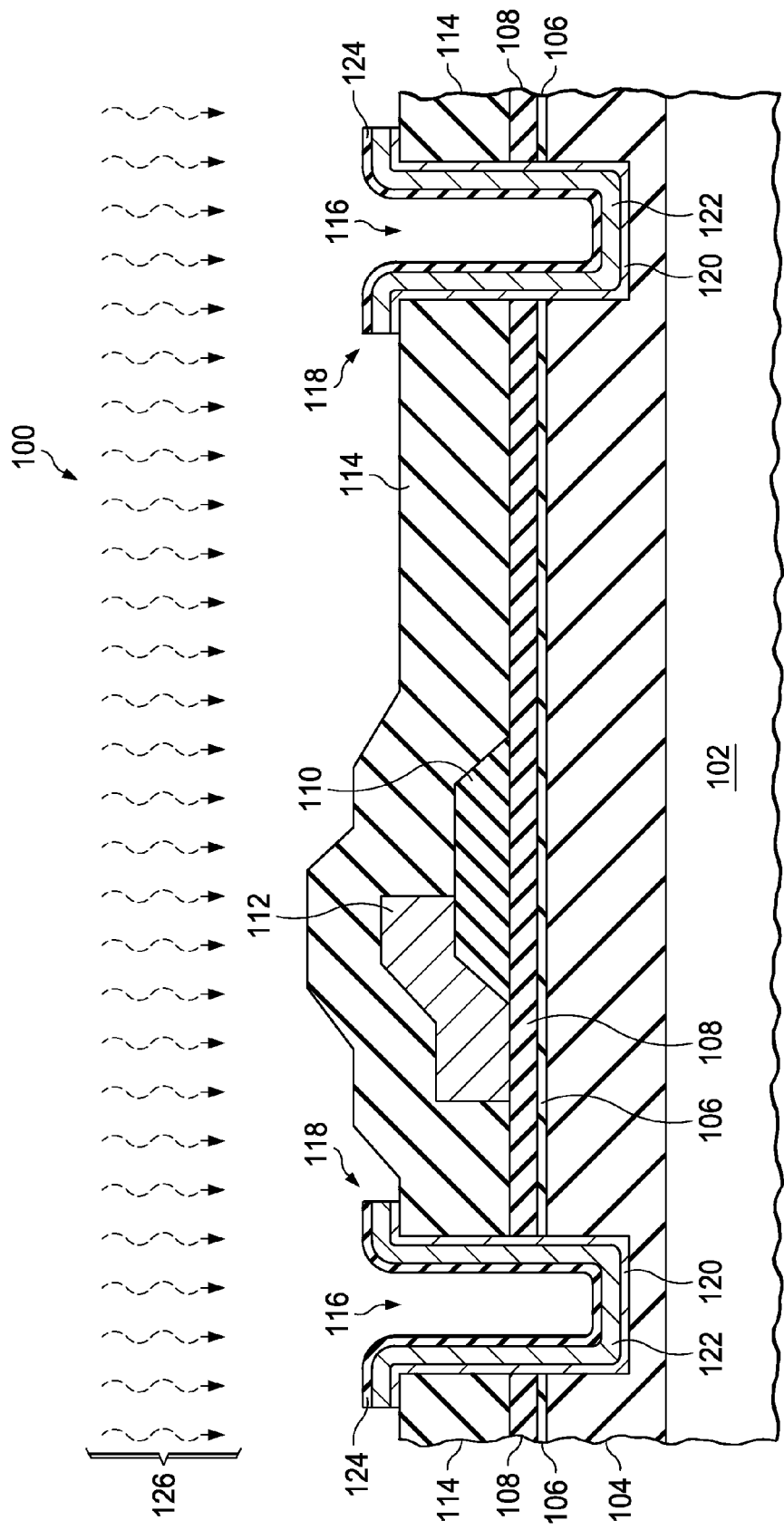

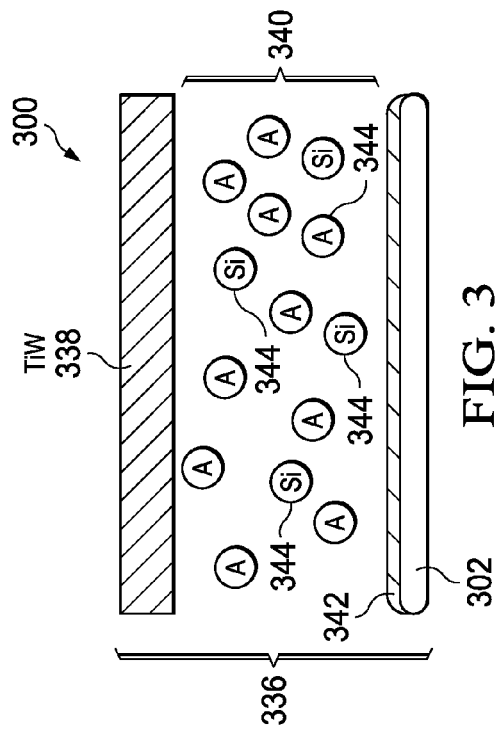
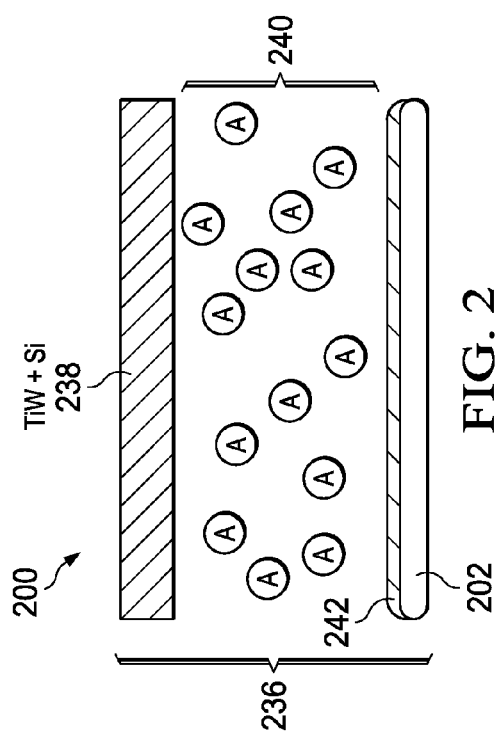
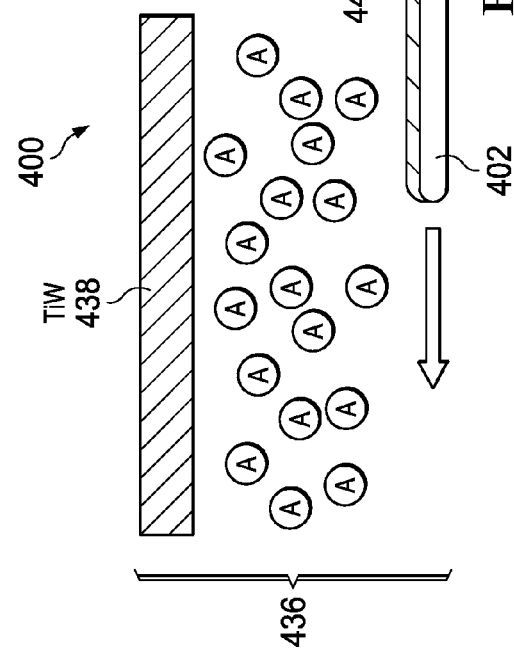

//FET DIELECTRIC RELIABILITY ENHANCEMENT

CROSS REFERENCE TO RELATED APPLICATIONS

This application is a divisional of U.S. Nonprovisional patent application Ser. No. 13/886,744, filed May 3, 2013, the contents of which are herein incorporated by reference in its entirety.

FIELD OF THE INVENTION

This invention relates to the field of semiconductor devices. More particularly, this invention relates to gallium nitride FETs in semiconductor devices.

BACKGROUND OF THE INVENTION

A gallium nitride field effect transistor (GaN FET) may have an insulated metal gate and tunneling source and drain contacts. Forming reliable source and drain contacts may require annealing at a temperature which causes degradation of the gate dielectric layer.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device may be formed by forming a metal gate with 2 atomic percent to 10 atomic percent silicon. The metal gate is formed over a gate dielectric layer containing silicon. A subsequent contact anneal may include heating for at least 30 seconds at a temperature of at least 750° C.

DESCRIPTION OF THE VIEWS OF THE DRAWING

FIG. 1A through FIG. 1E are cross sections of a semiconductor device depicted in successive stages of fabrication.

FIG. 2 through FIG. 4 depict exemplary processes for forming metal gates of GaN FETs with 2 atomic percent to 10 atomic percent silicon.

DETAILED DESCRIPTION OF EXAMPLE EMBODIMENTS

Figure 1C:
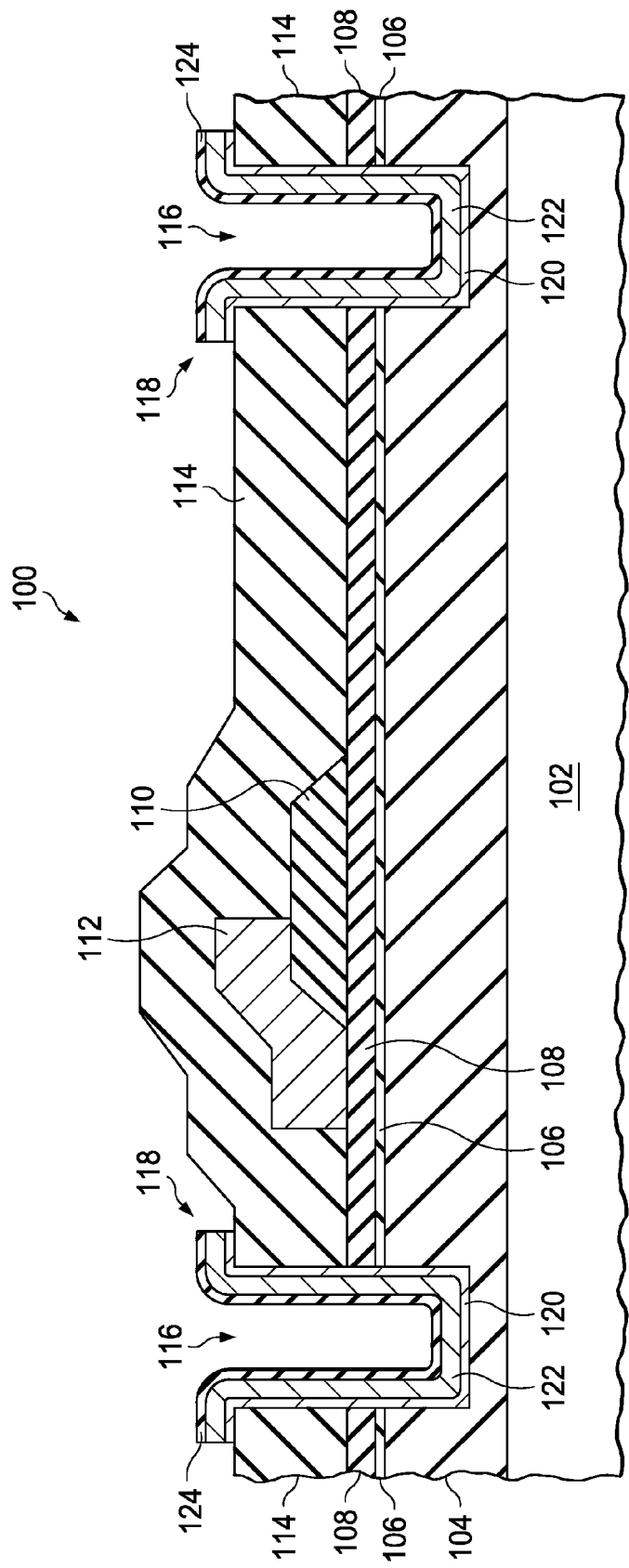

The following co-pending patent applications are related and hereby incorporated by reference:

U.S. patent application Ser. No. 13/886,378 (filed simultaneously with this application, entitled "AVALANCHE ENERGY HANDLING CAPABLE III-NITRIDE TRANSISTORS;"

U.S. patent application Ser. No. 13/886,410 (filed simultaneously with this application, entitled "III-NITRIDE ENHANCEMENT MODE TRANSISTORS WITH TUNABLE AND HIGH GATE-SOURCE VOLTAGE RATING;"

U.S. patent application Ser. No. 13/886,429 (filed simultaneously with this application, entitled "III-NITRIDE TRANSISTOR LAYOUT;"

U.S. patent application Ser. No. 13/886,652 (filed simultaneously with this application, entitled "LAYER TRANSFER OF SI100 ON TO III-NITRIDE MATERIAL FOR HETEROGENOUS INTEGRATION;"

U.S. patent application Ser. No. 13/886,688 (filed simultaneously with this application, entitled "RESURF III-NITRIDE HEMTS;"

U.S. patent application Ser. No. 13/886,709 (filed simultaneously with this application, entitled "METHOD TO FORM STEPPED DIELECTRIC FOR FIELD PLATE FORMATION;" and The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device may be formed by forming a silicon-containing gate dielectric layer, such as silicon nitride, over a semiconductor layer. A gate metal layer is formed over the gate dielectric layer; the gate metal layer includes 2 atomic percent to 10 atomic percent silicon during formation. The gate metal layer is patterned to form a metal gate. Contact metal is formed and possibly patterned to form source and drain contacts. A subsequent contact anneal heats the contact metal and gate for at least 30 seconds at a temperature of at least 750° C.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide the remainder of the atoms in the semiconductor material. Examples of III-N semiconductor materials are gallium nitride, boron gallium nitride, aluminum gallium nitride, indium nitride, indium aluminum nitride, and indium aluminum gallium nitride. Terms describing elemental formulas of materials do not imply a particular stoichiometry of the elements. III-N materials may be written with variable subscripts to denote a range of possible stoichiometries. For example, aluminum gallium nitride may be written as $Al_xGa_{1-x}N$ and indium aluminum gallium nitride may be written as $In_xAl_yGa_{1-x-y}N$. For the purposes of this description, the term GaN FET is understood to refer to a field effect transistor which includes III-N semiconductor materials.

The term "sputtered aluminum" is understood to refer to aluminum formed by sputtering. The sputtered aluminum may include copper, silicon, titanium and/or other elements, up to a few percent, so as to improve electromigration properties of the aluminum.

FIG. 1A through FIG. 1E are cross sections of a semiconductor device depicted in successive stages of fabrication. Referring to FIG. 1A, the semiconductor device 100 is formed on a substrate 102 which may have a low-defect layer of III-N semiconductor material at a top surface, for example, an unintentionally doped layer of gallium nitride. A barrier layer 104 of III-N semiconductor material is formed on the top surface of the substrate 102. The barrier layer 104 may include $Al_xGa_{1-x}N$ or $In_xAl_yGa_{1-x-y}N$, 2 to 30 nanometers thick. Forming the barrier layer 104 on the low-defect layer of III-N semiconductor material at the top surface of the substrate 102 generates a two-dimensional electron gas in the low-defect layer just below the barrier layer 104 with an electron density of, for example, $1 \times 10^{12}$ to $2 \times 10^{13}$ cm$^{-2}$. An optional cap layer 106 of 2 to 5 nanometers of gallium nitride may be formed over the barrier layer 104.

A silicon-containing gate dielectric layer 108 is formed over the barrier layer 104, and over the cap layer 106 if present. The gate dielectric layer 108 may be, for example, 10 to 20 nanometers of silicon nitride formed by low pressure chemical vapor deposition (LPCVD) or plasma enhanced chemical vapor deposition (PECVD). In other version of the instant example, the gate dielectric layer 108 may include one or more layers of silicon nitride, silicon dioxide and/or silicon oxynitride.

A layer of field dielectric 110 is formed on the gate dielectric layer 108 and patterned to have sloped edges adjacent to a channel region of the semiconductor device 100. The field dielectric 110 may include, for example, 100 to 300 nanometers of silicon nitride, formed by LPCVD or PECVD. A metal gate 112 is formed on the gate dielectric layer 108 over the channel region and overlapping the sloped edge of the field dielectric 110. The metal gate 112 may include at least 10 percent titanium, for example titanium tungsten alloy. The metal gate 112 further includes 2 atomic percent to 10 atomic percent silicon. The metal gate 112 may be formed, for example by an etch process or a liftoff process.

Referring to FIG. 1B, a passivation dielectric layer 114 is formed over the metal gate 112, the field dielectric 110 and the gate dielectric layer 108. The passivation dielectric layer 114 may include, for example, 200 to 300 nanometers of silicon nitride, formed by PECVD. Source and drain contact holes 116 are etched through the passivation dielectric layer 114, the gate dielectric layer 108 and the cap layer 106, and into the barrier layer 104 proximate to the two-dimensional electron gas. The source and drain contact holes 116 may be 1 to 10 microns wide.

Referring to FIG. 1C, contact metal 118 is formed in the source and drain contact holes 116 and patterned. The contact metal 118 may include, for example, a layer of titanium 120 40 to 100 nanometers thick sputtered in the source and drain contact holes 116, a layer of sputtered aluminum 122 50 to 200 nanometers thick formed on the titanium layer 120, and a layer of titanium nitride 124 30 to 80 nanometers thick formed on the sputtered aluminum layer 122 by reactive sputtering, also known as physical vapor deposition (PVD). In one version of the instant example, the contact metal 118 is formed so as to provide an open cavity in each of the source and drain contact holes 116. Forming the metal gate 112 and the passivation dielectric layer 114 prior to forming the source and drain contact holes 116 and the contact metal 118 advantageously allows closer gate-source spacing and more fabrication process latitude, because the contact metal 118 may overlap a top surface of the passivation dielectric layer 114 without interfering with the metal gate 112. In an alternate version of the instant example, formation of the source and drain contact holes 116 may be omitted so that the contact metal 118 is formed on an existing top surface of the III-N semiconductor material.

Referring to FIG. 1D, a contact anneal process 126 heats the contact metal 118 to at least 750° C. for at least 30 seconds. The contact anneal process 126 improves an electrical connection between the contact metal 118 and the two-dimensional electron gas by reducing an impedance of the electrical connection and making the electrical connection more ohmic, that is, making a current voltage relationship of the electrical connection more linear. Increasing the temperature of the contact anneal process 126 further improves the electrical connection. In one version of the instant embodiment, the contact anneal process 126 heats the contact metal 118 to at least 800° C. for at least 30 seconds. In another version, the contact anneal process 126 heats the contact metal 118 to at least 850° C. for at least 30 seconds. In a further version, the contact anneal process 126 heats the contact metal 118 to at least 900° C. for at least 30 seconds. The contact anneal process 126 may be performed, for example, in a rapid thermal processor (RTP) tool which heats the semiconductor device 100 using incandescent lamps. Forming the metal gate 112 to have 2 atomic percent to 10 atomic percent silicon reduces a net flow of silicon from the silicon-containing gate dielectric layer 108 into the metal gate 112, thereby advantageously improving dielectric integrity of the gate dielectric layer 108.

Figure 1E:
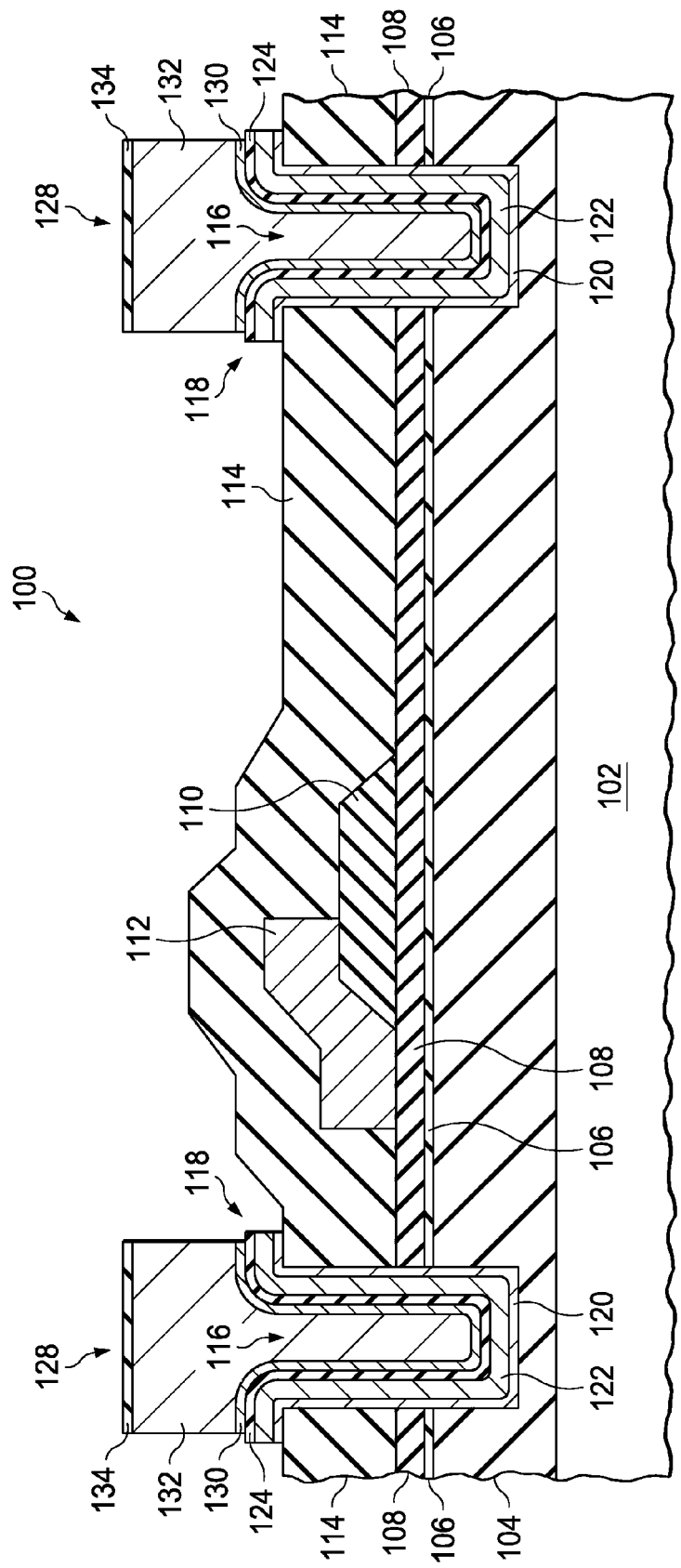

Referring to FIG. 1E, a first metallization layer 128 is formed on the contact metal 118. The first metallization layer 128 may include, for example, an adhesion layer 130 of 50 to 150 nanometers of sputtered titanium tungsten, a main metal layer 132 of 200 to 500 nanometers of sputtered aluminum formed on the adhesion layer 130, and an anti-refection layer 134 of 20 to 40 nanometers of titanium nitride formed on the main metal layer 132. The first metallization layer 128 is patterned so as to overlap the source and drain contact holes 116.

FIG. 2 through FIG. 4 depict exemplary processes for forming metal gates of GaN FETs with 2 atomic percent to 10 atomic percent silicon. Referring to FIG. 2, a substrate 202 of a semiconductor device 200 is positioned in a sputtering tool 236. The sputtering tool 236 includes a metal target 238 which has silicon incorporated in the metal target 238. Sputtering gas 240 such as argon is introduced into the sputtering tool 236 between the metal target 238 and the substrate 202. A plasma is formed in the sputtering gas 240 and electrical bias is applied to the metal target 238 so that metal and silicon are sputtered from the metal target 238 onto the substrate 202 to form a metal gate layer 242 incorporating silicon on the substrate 202. A concentration of silicon in the metal target 238 is selected so that the metal gate layer 242 has 2 atomic percent to 10 atomic percent silicon. After the metal gate layer 242 has been formed to a desired thickness, the metal gate layer 242 may be patterned to form a metal gate such as the metal gate 112 depicted in FIG. 1A through FIG. 1E.

Referring to FIG. 3, a substrate 302 of a semiconductor device 300 is positioned in a sputtering tool 336. The sputtering tool 336 includes a metal target 338 which has less than 1 atomic percent silicon. Sputtering gas 340, which includes an inert gas such as argon and a silicon species 344 such as silane, is introduced into the sputtering tool 336 between the metal target 338 and the substrate 302. A plasma is formed in the sputtering gas 340 and electrical bias is applied to the metal target 338 so that metal is sputtered from the metal target 338 onto the substrate 302 and silicon from the silicon species 344 is incorporated in the sputtered metal to form a metal gate layer 342 incorporating silicon on the substrate 302. A pressure and a flow rate of the silicon species 344 is selected so that the metal gate layer 342 has 2 atomic percent to 10 atomic percent silicon. After the metal gate layer 342 has been formed to a desired thickness, the metal gate layer 342 may be patterned to form a metal gate such as the metal gate 112 depicted in FIG. 1A through FIG. 1E.

Referring to FIG. 4, a substrate 402 of a semiconductor device 400 is positioned in a sputtering tool 436. The sputtering tool 436 includes a metal target 438 and a separate silicon target 446. Sputtering gas 440 such as argon is introduced into the sputtering tool 436 between the metal target 438 and the silicon target 446 and the substrate 402. A plasma is formed in the sputtering gas 440 and electrical bias is applied to the metal target 438 and to the silicon target 446 so that metal and silicon are sputtered from the metal target 438 and the silicon target 446, respectively, onto the substrate 402 to form a metal gate layer 442 incorporating silicon on the substrate 402. In one version of the instant embodiment, the substrate 402 may remain stationary with respect to the metal target 438 and the silicon target 446 during formation of the metal gate layer 442 while sputtering occurs concurrently at both targets 438 and 446. In another version, the substrate 402 may move alternately between a first position under the metal target 438 in which predominantly metal is sputtered onto the substrate 402, and a second position under the silicon target 446 in which predominantly silicon is sputtered onto the substrate 402. Process parameters such as sputter rates from the metal target 438 and the silicon target 446 are selected so that the metal gate layer 442 has 2 atomic percent to 10 atomic percent silicon. After the metal gate layer 442 has been formed to a desired thickness, the metal gate layer 442 may be patterned to form a metal gate such as the metal gate 112 depicted in FIG. 1A through FIG. 1E.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a substrate which has a semiconductor layer disposed over a top surface of said substrate;
   a gate dielectric layer disposed over said semiconductor layer, said gate dielectric layer containing silicon;
   a metal gate disposed over said gate dielectric layer, said metal gate including 2 atomic percent to 10 atomic percent silicon; and
   contact metal disposed in source and drain contact holes proximate to said metal gate.

2. A semiconductor device, comprising:
   a substrate which has a semiconductor layer including III-N semiconductor material disposed over a top surface of said substrate;
   a gate dielectric layer disposed over said semiconductor layer, said gate dielectric layer containing silicon;
   a metal gate disposed over said gate dielectric layer, said metal gate including 2 atomic percent to 10 atomic percent silicon; and
   source and drain tunneling contacts disposed proximate to said metal gate, said source and drain tunneling contacts having contact metal disposed in source and drain contact holes which make tunneling connections to a two-dimensional electron gas disposed in said III-N semiconductor material.

3. The semiconductor device of claim 2, in which said metal gate includes 4 atomic percent to 6 atomic percent silicon.

4. The semiconductor device of claim 2, in which said gate dielectric layer includes silicon nitride.

5. The semiconductor device of claim 2, in which said metal gate includes at least 10 percent titanium.

6. The semiconductor device of claim 2, in which said metal gate includes titanium tungsten.

7. The semiconductor device of claim 2, in which said contact metal includes a titanium layer contacting said semiconductor layer.

8. The semiconductor device of claim 7, in which said contact metal includes a sputtered aluminum layer disposed on said titanium layer.

* * * * *